United States Patent
Shim et al.

(10) Patent No.: US 7,382,035 B2
(45) Date of Patent: Jun. 3, 2008

(54) SCHOTTKY DIODE WITH LOW LEAKAGE CURRENT AND FABRICATION METHOD THEREOF

(75) Inventors: Dong-sik Shim, Suwon-si (KR); Young-hoon Min, Anyang-si (KR); Il-jong Song, Suwon-si (KR); Ja-nam Ku, Yongin-si (KR); Hyung Choi, Seongnam-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 142 days.

(21) Appl. No.: 11/356,125

(22) Filed: Feb. 17, 2006

(65) Prior Publication Data

US 2006/0186421 A1 Aug. 24, 2006

(30) Foreign Application Priority Data

Feb. 21, 2005 (KR) .................... 10-2005-0014177

(51) Int. Cl.
*H01L 29/47* (2006.01)

(52) U.S. Cl. .................... 257/471; 257/74; 257/94

(58) Field of Classification Search ............... 257/471, 257/94, 74
See application file for complete search history.

(56) References Cited

U.S. PATENT DOCUMENTS

| 4,346,265 | A | * | 8/1982 | Buss et al. ............. 379/375.01 |
| 6,339,249 | B1 | * | 1/2002 | Keller .......................... 257/480 |
| 2001/0034116 | A1 | * | 10/2001 | Lee et al. .................... 438/604 |
| 2005/0133818 | A1 | * | 6/2005 | Johnson et al. ............. 257/192 |

FOREIGN PATENT DOCUMENTS

KR 2003-0027701 A 4/2003

* cited by examiner

*Primary Examiner*—Douglas M. Menz
(74) *Attorney, Agent, or Firm*—Sughrue Mion, PLLC

(57) ABSTRACT

A low leakage Schottky diode and fabrication method thereof. The Schottky diode includes a n-type semiconductor; an anode having a circular periphery formed in a region above the n-type semiconductor; and a cathode formed in a region above the n-type semiconductor and having a pattern surrounding and set apart from the outer periphery of the anode. Because there are no edges at the anode and cathode interface, leakage current is minimized.

8 Claims, 6 Drawing Sheets

SCHOTTKY DIODE WITH LOW LEAKAGE CURRENT AND FABRICATION METHOD THEREOF

CROSS-REFERENCE TO RELATED APPLICATIONS

This application claims the benefit under 35 U.S.C. § 119 (a) from Korean Patent Application No. 2005-14177 filed on Feb. 21, 2005 in the Korean Intellectual Property Office, the entire disclosure of which is incorporated herein by reference.

BACKGROUND OF THE INVENTION

1. Field of the Invention

The present invention relates to a Schottky diode and fabrication method thereof. More particularly, the present invention relates to a Schottky diode having a low leakage current and method of fabricating the Schottky diode.

2. Description of the Related Art

A Schottky diode makes use of rectification which occurs at a contact surface between a metal and a semiconductor. The Schottky diode exhibits excellent characteristics, and has been widely used in systems operating at a high frequency, such as a Radio Frequency IDentification (RFID) system.

FIG. 1 illustrates a Schottky diode. In FIG. 1, the Schottky diode includes an anode/anode electrode 10, a cathode/cathode electrode 20, and an n-type semiconductor 30 that are connected to one another.

The anode/anode electrode 10 and the n-type semiconductor 30 form a Schottky contact, and a Schottky barrier is present therebetween. Hence, current can flow from the anode/anode electrode 10 toward the n-type semiconductor 30. Meanwhile, the cathode/cathode electrode 20 and the n-type semiconductor 30 form an ohmic contact.

Referring to FIG. 1, when a forward voltage is applied to the Schottky diode, a current I flows in a direction indicated by the arrow.

FIG. 2 is a plane view of a Schottky diode. Referring to FIG. 2, the Schottky diode is configured with an anode/anode electrode 40 and a cathode/cathode electrode 50 disposed over an n-well 60 defined on a p-type substrate 70, in a pattern as shown in FIG. 2.

As noted, a number of edges or corners are formed at the anode/anode electrode 40 and the cathode/cathode electrode 50, some of which are marked by ○.

Such edges can cause a leakage current which degrades performance of the Schottky diode. Thus, there is a need to overcome this shortcoming of a conventional Schottky diode.

SUMMARY OF THE INVENTION

The present invention has been achieved to address the above-mentioned and other problems and disadvantages occurring in conventional arrangements, and an object of the present invention is to provide a Schottky diode exhibiting reduced leakage current, and a method of fabricating the Schottky diode without having the above-noted edges or corners.

The above objects of the present invention have been achieved by providing a Schottky diode including a n-type semiconductor; an anode formed in a region above the n-type semiconductor; and a cathode formed in another region above the n-type semiconductor, the cathode having a pattern set apart from and surrounding an outer circle of the anode.

The anode may have an elliptical pattern, and the cathode may have an elliptical ring pattern.

The outer circle of the anode may have a geometry similar to an inner periphery of the cathode elliptical ring.

The curvature of the outer circle of the anode may be equal to the curvature of the inner periphery of the cathode.

The Schottky diode may further include an insulating layer deposited above the anode and the cathode; an anode electrode formed through and above the insulating layer and connecting to the anode; and a cathode electrode formed through and above the insulating layer and connecting to the cathode.

In accordance with the above object of the present invention, a method of fabricating the Schottky diode includes forming an anode having a circular periphery in a region above an n-type semiconductor; and forming a cathode in another region above the n-type semiconductor so as to have a pattern surrounding and set apart from the outer periphery of the anode.

The anode may have an elliptical pattern, and the cathode may have an elliptical ring pattern.

The outer circle of the anode may have a geometry similar to an inner periphery of the cathode elliptical ring.

The curvature of the outer circle of the anode may be equal to the curvature of the inner periphery of the cathode.

The fabrication method may further include depositing an insulating layer above the anode and the cathode; forming an anode electrode through and above the insulating layer, the anode electrode connecting to the anode; and forming a cathode electrode through and above the insulating layer, the cathode electrode connecting to the cathode.

BRIEF DESCRIPTION OF THE DRAWING FIGURES

These and/or other aspects and advantages of the invention will become apparent and more readily appreciated from the following description of exemplary embodiments, taken in conjunction with the accompanying drawing figures of which:

DETAILED DESCRIPTION OF THE EMBODIMENTS

Figure 1:
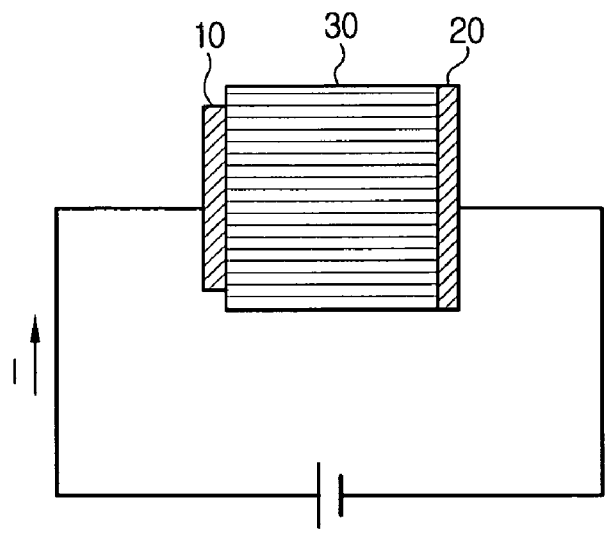
FIG. 1 is a diagram conceptually illustrating a Schottky diode.
Figure 2:
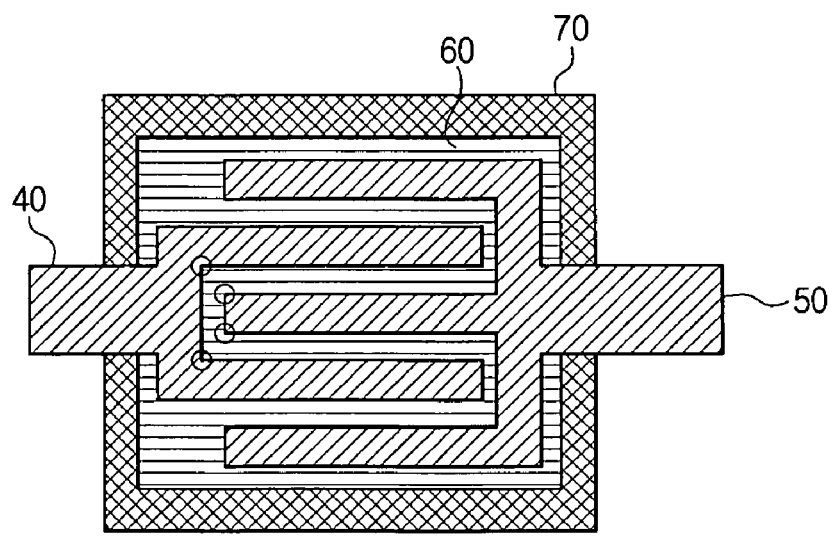
FIG. 2 is a plane view of a conventional Schottky diode.

Certain exemplary embodiments of the present invention will now be described in greater detail with reference to the accompanying drawings.

In the following description, the same drawing reference numerals are used to identify the same elements in the various drawings. The following detailed description is provided to assist in a comprehensive understanding of the invention. However, the present invention should not be construed as being limited thereto. Also, well-known functions or constructions are not described in detail since they would obscure the invention in unnecessary detail.

Figure 3:
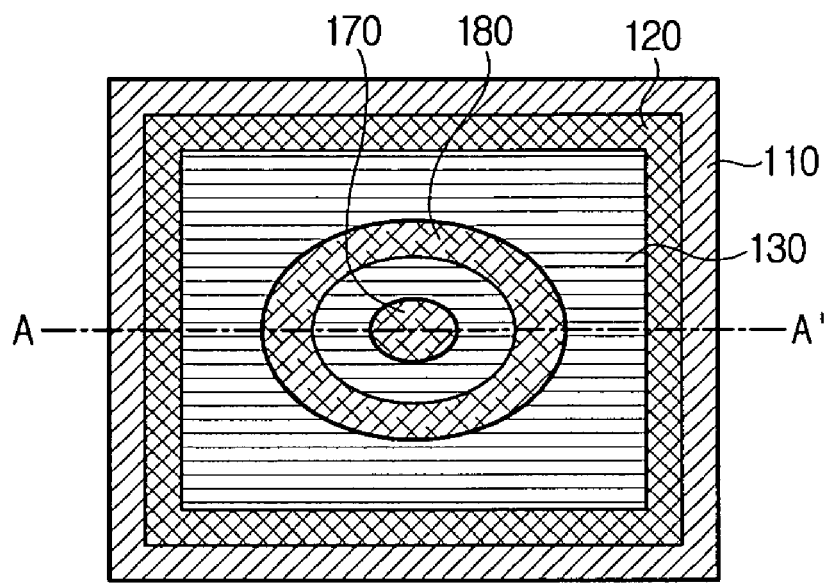
FIG. 3 is a plane view of a Schottky diode according to an embodiment of the present invention.
Figure 4A:
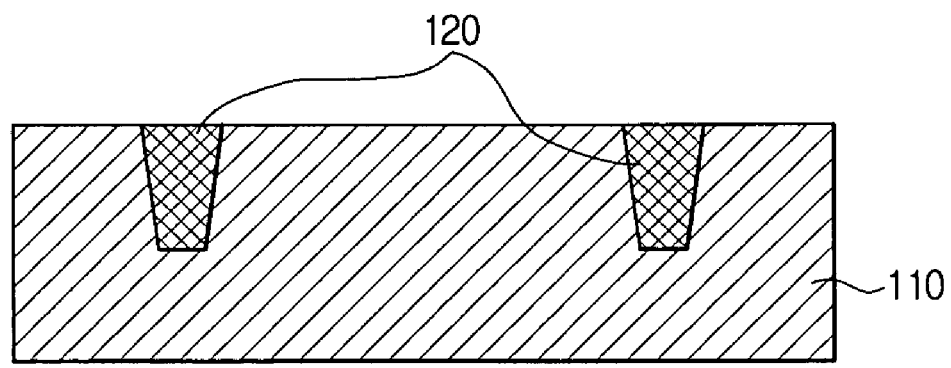
FIGS. 4A through 4J are cross sectional views illustrating a method of fabricating the Schottky diode according to an embodiment of the present invention.
Figure 4B:
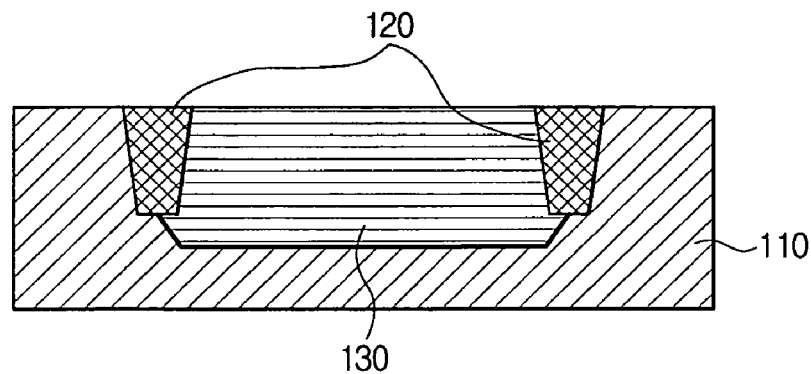
Figure 4C:
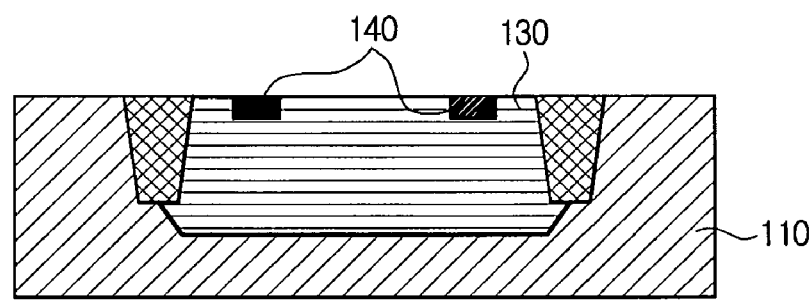
Figure 4D:
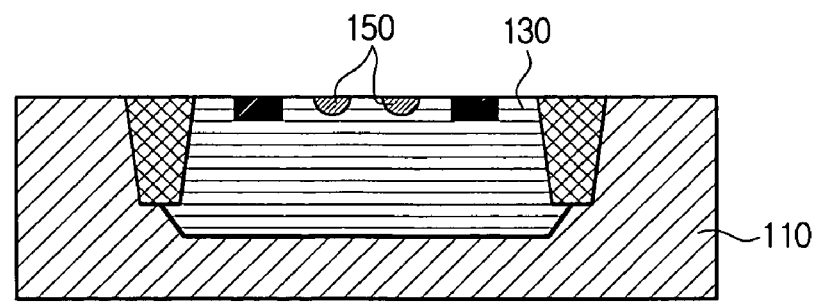
Figure 4E:
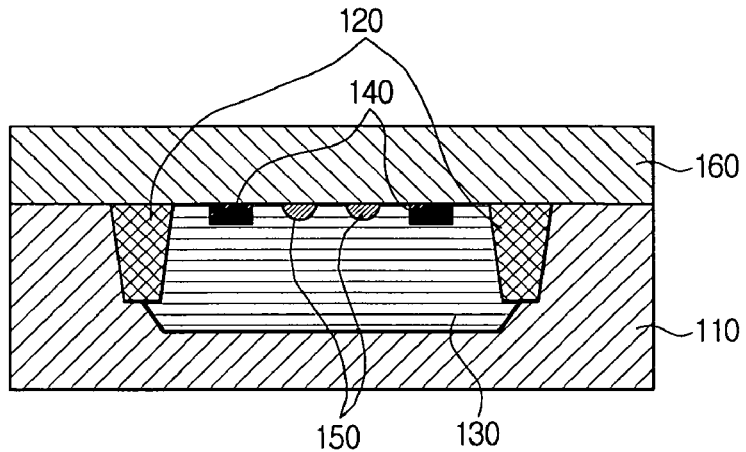
Figure 4F:
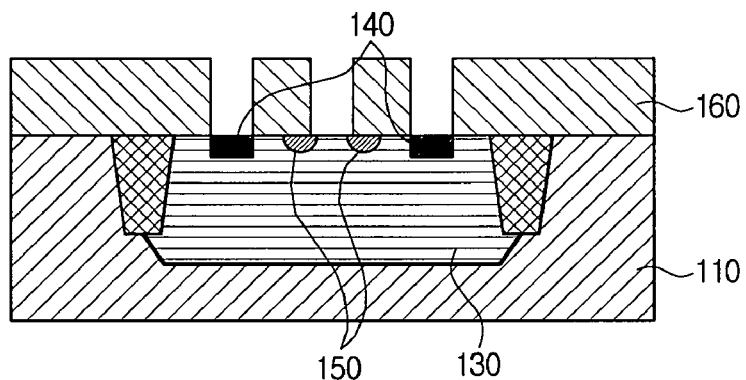
Figure 4G:
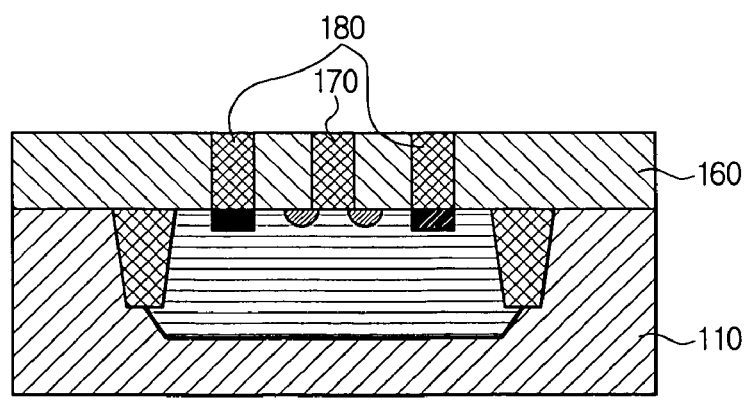
Figure 4H:
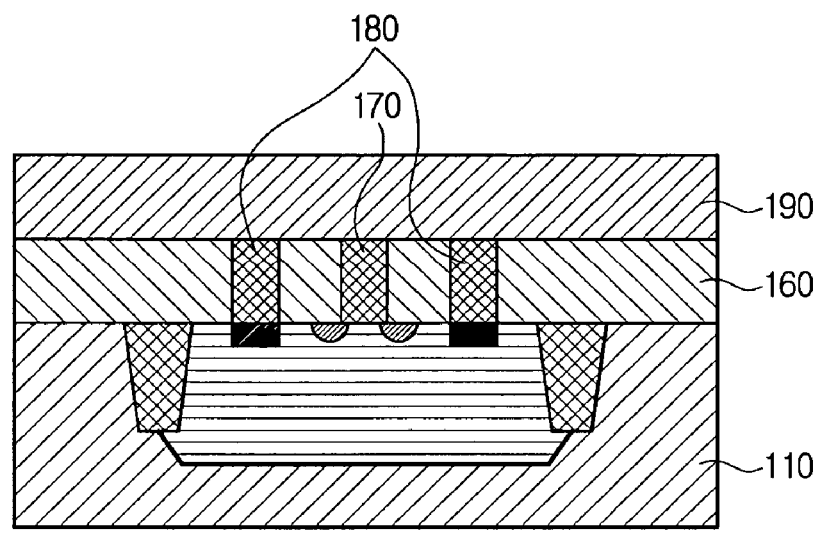
Figure 4I:
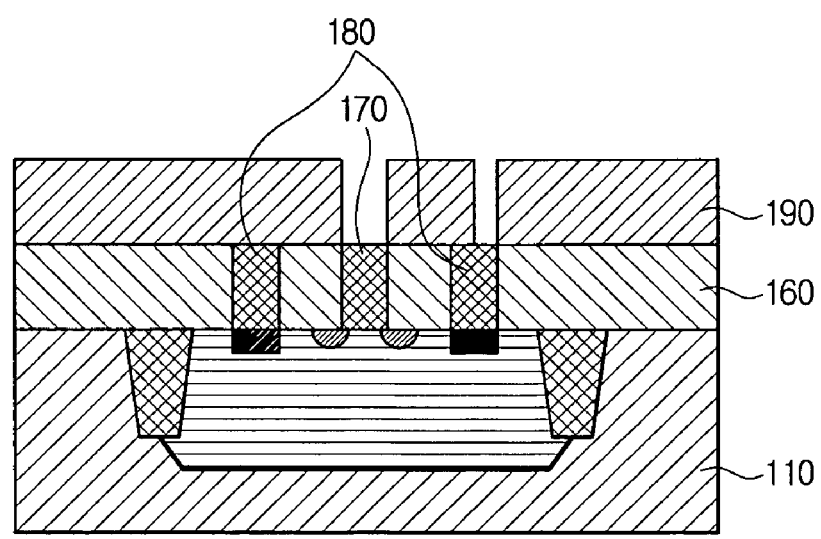
Figure 4J:
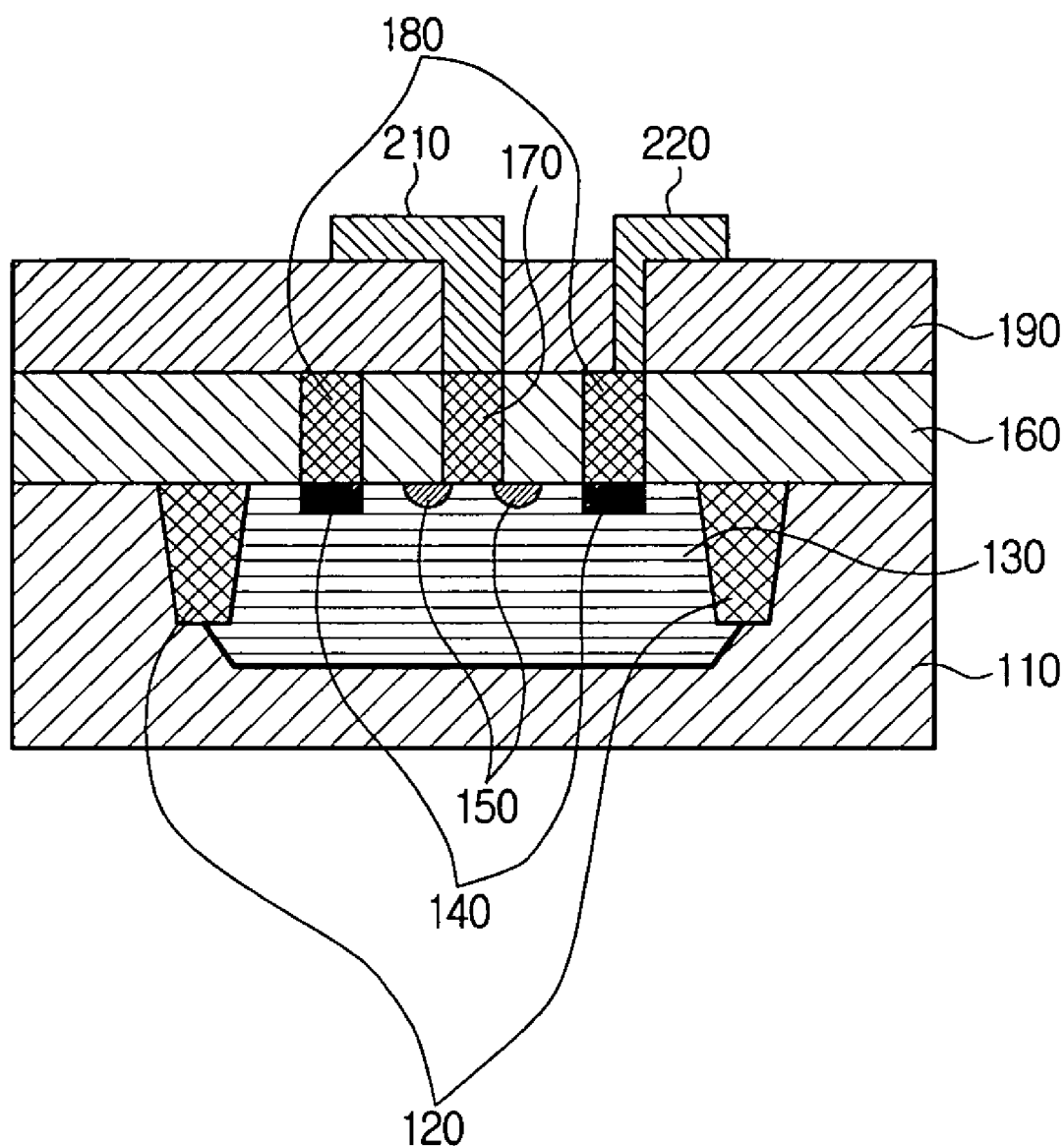

FIG. 3 is a plane view of a Schottky diode according to an embodiment of the present invention, and FIG. 4J is a cross sectional view of the Schottky diode, specifically, taken along a one-dot chain line A-A' of FIG. 3.

Referring now to FIGS. 3 and 4J, the Schottky diode includes a p-type substrate 110, an insulator 120, an n-well 130, a N+ region 140, a P+ region 150, a first insulating layer 160, a second insulating layer 190, an anode electrode 210, and a cathode electrode 220.

The n-well 130 is an n-type semiconductor formed inside the insulator 120 on the p-type substrate 110.

The anode 170 and the cathode 180 are formed in the first insulating layer 160 above the n-well 130. The anode 170 is formed in an elliptical pattern. The cathode 180 surrounds the anode 170 in an elliptical ring pattern. That is, the cathode 180 is spaced or rather set apart from an external boundary of the anode 170 and surrounds the anode 170 at a distance.

The Schottky diode has a structure in which the cathode 180 surrounds the anode 170. Because the cathode 180 and the anode 170 have an elliptical ring pattern and an elliptical pattern respectively, there are no edges at all at the anode 170 and the cathode 180. Therefore, leakage current in this Schottky diode structure is minimized.

Since a circle is one type of elliptical figure, the anode 170 may have a circular pattern and the cathode 180 may have a ring pattern around the anode 170.

It is advantageous to form the outer circle of the anode 170 and the inner ring of the cathode 180 so as to have a similar shape or geometry. In other words, a curvature of the outer circle of the anode 170 is advantageously equal to a curvature of the inner ring of the cathode 180. The equal curvatures maintain a uniform interval between the anode 170 and the cathode 180.

The N+ region 140 (not shown in FIG. 3) is formed on the n-well 130 under the cathode 180. The N+ region 140 has the same pattern as the cathode 180. The N+ region 140 is configured for providing ohmic contact between the cathode 180 and the n-well 130.

The P+ region 150 (not shown in FIG. 3) is formed on the n-well 130 under the anode 170. The P+ region 150 has an elliptical ring pattern surrounding the outer circle of the anode 170. The P+ region 150 is provided to prevent leakage current from flowing into the anode 170. In this respect, the P+ region 150 is called a guard ring.

An anode electrode 210 and a cathode electrode 220 (not shown in FIG. 3) are formed through and on the second insulating layer 190 which is above the anode 170 and the cathode 180. The anode electrode 210 contacts in part the upper portion of the anode 170 and is electrically connected to the anode 170. The cathode electrode 220 contacts in part the upper portion of the cathode 180 and is electrically connected to the cathode 180.

The anode electrode 210 and the cathode electrode 220 are formed through and on the second insulating layer 190 because this configuration can prevent electrical contact between the anode electrode 210 and the cathode 180. Such disadvantageous electrical contact or short circuit can be caused by the anode 170 which is surrounded by the cathode 180. Without the intervening second insulating layer 190, the anode electrode 210 would contact the cathode 180 so as electrically contact the cathode 180.

Hereafter, a method of fabricating the Schottky diode is explained in reference to FIG. 4A through FIG. 4J. FIGS. 4A through 4J are cross sectional views showing a method of fabricating the Schottky diode according to an embodiment of the present invention, taken along the one-dot chain line of A-A' in FIG. 3.

Referring first to FIG. 4A, a space for the n-well 130 is prepared by forming a trench insulator 120 in the p-type substrate 110. As shown in FIG. 3, the pattern of the insulator 120 is rectangular. The insulator 120 may be formed so as to have other various patterns. That is, the pattern or geometry of the insulator 120 can be arbitrarily selected. The insulator 120 prevents electrical connection between the n-well 130 and external electric elements.

The n-well 130 is defined in the insulator 120 over the p-type substrate 110, as shown in FIG. 4B.

Referring to FIG. 4C, the N+ region 140 is defined in a region of the n-well 130. The N+ region 140 is located under the cathode 180 which will be subsequently formed. The N+ region 140 has the same pattern as the cathode 180 to be formed.

In further detail, the pattern of the cathode 180 is an elliptical ring surrounding the anode 170. In other words, the cathode 180 has a pattern that surrounds the outer circle of the anode 170 at a predetermined distance. Preferably, the outer circle of the anode 170 and the inner ring of the cathode 180 have substantially the same geometry or peripheral shape. That is, the curvature of the outer circle of the anode 170 is preferably equal to the curvature of the inner ring of the cathode 180. This is done to maintain a uniform interval between the anode 170 and the cathode 180.

Next, as shown in FIG. 4D, the P+ region 150 is defined relative to the n-well 130. The P+ region 150 is located under the anode 170 which will be subsequently formed. The pattern of the P+ region 150 is an elliptical ring surrounding the outer circle of the anode 170 that has the elliptical pattern to be formed.

In FIG. 4E, the first insulating layer 160 is deposited over the p-type substrate 110, the insulator 120, the n-well 130, the N+ region 140, and the P+ region 150.

Next, as shown in FIG. 4F, regions for the anode 170 and the cathode 180 are defined by etching certain regions of the first insulating layer 160. Specifically, a region above the N+ region 140 is etched, and a region above the P+ region 150 in part and n-well 130 within the P+ region 150 pattern is etched.

The anode 170 and the cathode 180 are formed as shown in FIG. 4G. According to the above-described fabrication technique, the anode 170 is formed to have an elliptical pattern, and the cathode 180 is formed to have an elliptical ring pattern encircling the anode 170.

In FIG. 4H, the second insulating layer 190 is deposited over the first insulating layer 160, the anode 170, and the cathode 180.

Next, regions for the anode electrode 210 and the cathode electrode 220 are defined by etching certain regions of the second insulating layer 190, as shown in FIG. 4I. Particularly, a region above the anode 170 and a partial region above the cathode 180 are removed or etched in part.

Finally, in FIG. 4J, the anode electrode 210 and the cathode electrode 220 are formed.

In this manner, fabrication of the Schottky diode according to an embodiment of the present invention is completed.

The insulator 120, n-well 130, N+ region 140, P+ region 150, first insulating layer 160, second insulating layer 190, anode 170, anode electrode 210, cathode 180 and cathode electrode 220 can be formed in the p-type substrate 110 by common lithography, lift-off, diffusion, ion-implantation and wet and dry etching techniques, etc., well known to those of ordinary skill in the art.

As set forth above, the Schottky diode is configured such that the cathode having an elliptical ring pattern surrounds the anode having an elliptical pattern. Accordingly, there are no edges at the anode and cathode interface. Therefore, leakage current is minimized and the Schottky diode can operate with far improved capability.

While the present invention has been particularly shown and described with reference to exemplary embodiments thereof, it will be understood by those skilled in the art that various changes in form and detail may be made therein without departing from the spirit and scope of the invention as defined by the appended claims.

What is claimed is:

1. A Schottky diode comprising:
   a n-type semiconductor;
   an anode having a curved periphery formed in a region above the n-type semiconductor;
   a cathode formed in another region above the n-type semiconductor and having a pattern surrounding and set apart from the outer periphery of the anode;
   an insulating layer deposited above the anode and the cathode;
   an anode electrode which is formed through and above the insulating layer and connecting to the anode; and
   a cathode electrode formed through and above the insulating layer and connecting to the cathode.

2. The Schottky diode as claimed in claim 1, wherein the anode has an elliptical pattern, and the cathode has an elliptical ring pattern.

3. The Schottky diode as claimed in claim 1, wherein the cathode has a ring pattern and the outer periphery of the anode has a geometry corresponding to that of the inner periphery of the cathode.

4. The Schottky diode as claimed in claim 3, wherein the outer periphery of the anode has a curvature substantially the same as that of the inner periphery of the cathode.

5. A method of fabricating a Schottky diode, comprising:
   forming an anode having a curved periphery in a region above a n-type semiconductor;
   forming a cathode in another region above the n-type semiconductor and having a pattern surrounding and set apart from the outer periphery of the anode
   depositing an insulating layer above the anode and the cathode;
   forming an anode electrode through and above the insulating layer, the anode electrode connecting to the anode; and
   forming a cathode electrode through and above the insulating layer, the cathode electrode connecting to the cathode.

6. The method as claimed in claim 5, wherein the anode has an elliptical pattern, and the cathode has an elliptical ring pattern.

7. The method as claimed in claim 5, wherein the cathode has a ring pattern and the outer periphery of the anode has a geometry corresponding to that of the inner periphery of the cathode.

8. The method as claimed in claim 7, wherein the outer periphery of the outer circle of the anode has a curvature substantially the same as that of the inner periphery of the cathode.

* * * * *